United States Patent
Acuna

(10) Patent No.: US 10,775,701 B2
(45) Date of Patent: Sep. 15, 2020

(54) CAPILLARY FOR USE IN A DROPLET GENERATOR

(71) Applicant: MOLEX, LLC, Lisle, IL (US)

(72) Inventor: Robert Acuna, Lisle, IL (US)

(73) Assignee: Molex, LLC, Lisle, IL (US)

(*) Notice: Subject to any disclaimer, the term of this patent is extended or adjusted under 35 U.S.C. 154(b) by 0 days.

(21) Appl. No.: 16/321,021

(22) PCT Filed: Jul. 26, 2017

(86) PCT No.: PCT/US2017/043918
§ 371 (c)(1),
(2) Date: Jan. 26, 2019

(87) PCT Pub. No.: WO2018/022738
PCT Pub. Date: Feb. 1, 2018

(65) Prior Publication Data
US 2019/0163069 A1     May 30, 2019

Related U.S. Application Data

(60) Provisional application No. 62/366,847, filed on Jul. 26, 2016, provisional application No. 62/394,828, filed on Sep. 15, 2016.

(51) Int. Cl.
*G03F 7/20* (2006.01)
*H05G 2/00* (2006.01)

(52) U.S. Cl.
CPC ......... *G03F 7/70033* (2013.01); *H05G 2/006* (2013.01)

(58) Field of Classification Search
USPC .................................................. 250/504 R
See application file for complete search history.

(56) References Cited

U.S. PATENT DOCUMENTS

| 6,324,256 | B1 | 11/2001 | McGregor et al. |
| 7,322,507 | B2 * | 1/2008 | Kim .................... B23K 20/007 228/1.1 |
| 2004/0094606 | A1 | 5/2004 | Perlberg et al. |

(Continued)

FOREIGN PATENT DOCUMENTS

| CN | 200982965 Y | 11/2007 |
| CN | 103718654 A | 4/2014 |

(Continued)

OTHER PUBLICATIONS

International Search Report and Written Opinion received for PCT application No. PCT/US2017/043918, dated Nov. 7, 2017, 9 pages.

(Continued)

*Primary Examiner* — Kiet T Nguyen
(74) *Attorney, Agent, or Firm* — Molex, LLC

(57) ABSTRACT

A capillary formed from a unitary manufactured glass includes a main portion and an end portion. The main portion is elongated and has a first aperture with a first inner diameter. The end portion, which can have a knob-like shape, has a second aperture that tapers from a second inner diameter to a third inner diameter and the third inner aperture joins to the first aperture. The second inner diameter is larger than the first inner diameter. If desired, the third inner diameter can be smaller than the first inner diameter.

11 Claims, 4 Drawing Sheets

(56) References Cited

U.S. PATENT DOCUMENTS

| | | | |
|---|---|---|---|
| 2006/0188213 A1* | 8/2006 | Griffin | G02B 6/3835 385/139 |
| 2009/0230326 A1* | 9/2009 | Vaschenko | H05G 2/003 250/492.2 |
| 2010/0258747 A1* | 10/2010 | Vaschenko | G03F 7/70033 250/504 R |
| 2013/0206857 A1 | 8/2013 | Ivri | |
| 2013/0313336 A1 | 11/2013 | Doak et al. | |
| 2014/0091155 A1 | 4/2014 | Jordan et al. | |
| 2015/0293456 A1 | 10/2015 | Dijksman et al. | |

FOREIGN PATENT DOCUMENTS

| | | |
|---|---|---|
| CN | 203853217 U | 10/2014 |
| CN | 104501482 A | 4/2015 |
| EP | 1445993 A2 | 8/2004 |
| WO | 2012/100205 A2 | 7/2012 |
| WO | 2018/022738 A1 | 2/2018 |

OTHER PUBLICATIONS

International Preliminary Report on Patentability received for PCT Application No. PCT/US2017/043918, dated Feb. 7, 2019, 8 pages.
Extended European Search report and opinion received for EP application No. 17835197.9, dated Feb. 28, 2020, 7 pages.

\* cited by examiner

CAPILLARY FOR USE IN A DROPLET GENERATOR

This application claims priority to PCT application No. PCT/US2017/043918, filed. Jul. 26, 2017, which further claims priority to U.S. Application Ser. No. 62/366,847, filed Jul. 26, 2016 and to U.S. Application Ser. No. 62/394,828, filed Sep. 15, 2016, which are incorporated herein by reference in their entirety.

TECHNICAL FIELD

The present disclosure is related to the field of capillaries, more specifically to the field of capillaries suitable for use in droplet generators, which droplet generators are suitable for use in lithographic systems.

DESCRIPTION OF RELATED ART

As is taught in United States Patent Publication No. US 2015/0293456 A1, entitled "Droplet Generator, EUV Radiation Source, Lithographic Apparatus, Method For Generating Droplets And Device Manufacturing Method", the contents of which are incorporated herein by reference in their entirety, droplet generators generally include a capillary. The capillary is generally a tube-like structure having a nozzle at a first end portion thereof, and which is in fluid communication with a reservoir of molten material at an opposite, second end portion. The molten material in the reservoir flows into the second end portion of the capillary and toward the nozzle, and the nozzle generates the formation or droplets of molten material. As noted in the foregoing publication, the capillary is formed of glass and has the following approximate dimensions: length of approximately 15-50 millimeters, inner diameter of approximately 0.5 to 0.7 millimeters, and wall thickness of approximately 0.15 to 0.25 millimeters. These types of capillaries, however, have suffered from a number of issues. For example, under increased pressures, the capillaries (and thus the droplet generators) may be subject to undesired movement with respect to the reservoir. While attempts have been made to design capillaries that overcome this and other issues, no acceptable solution has yet been provided, primarily due to the extremely small size of the capillary and the specific material used to form same. Consequentially, further improvements to the design of capillaries for droplet generators would be appreciated by certain individuals.

SUMMARY

A capillary includes a main portion with a first aperture and an end portion that is enlarged with a second aperture. The end portion acts as a stop to aid in retaining the capillary in a desired position under increased pressures. The second aperture can be a uniquely sized/shaped aperture to receiving molten material therein and can have funnel characteristics. Advantageously, the entire capillary, including the end portion, is formed as a single piece of material, which is preferably a manufactured glass, such as quartz, and more preferably fused silica. The second aperture tapers from a larger inner diameter to a smaller inner diameter. The second aperture joins to the first aperture and thus allows the smaller inner diameter to join with an inner diameter of the first aperture.

BRIEF DESCRIPTION OF THE DRAWINGS

The current disclosure is illustrated by way of example and not limited in the accompanying figured in which like reference numerals indicate similar elements and in which.

DETAILED DESCRIPTION

The detailed description that follows describes exemplary embodiments and is not intended to be limited to the expressly disclosed combination(s). Therefore, unless otherwise noted, features disclosed herein may be combined to form additional combinations that were not otherwise shown for purposes of brevity.

Figure 1:
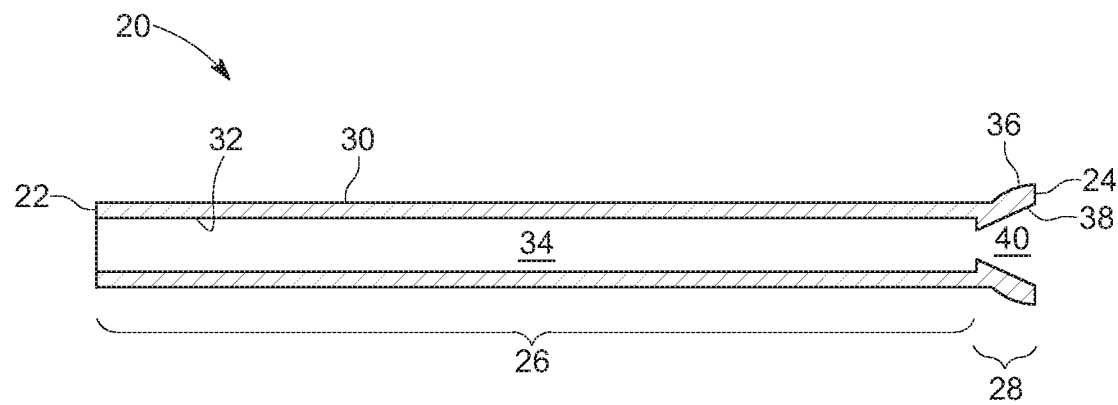
FIG. 1 illustrates a cross-section of an embodiment of a capillary.
Figure 2:
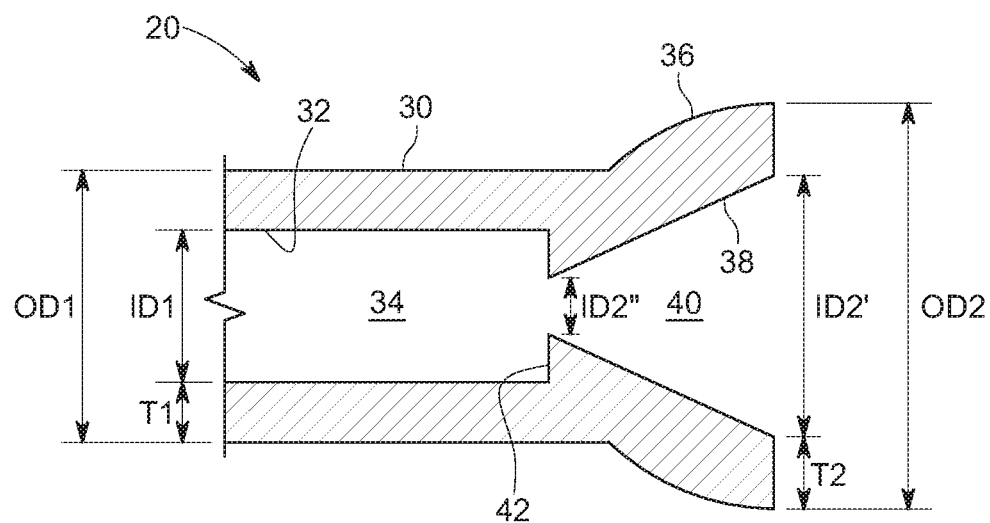
FIG. 2 illustrates an enlarged view of the embodiment depicted FIG. 1.
Figure 3:
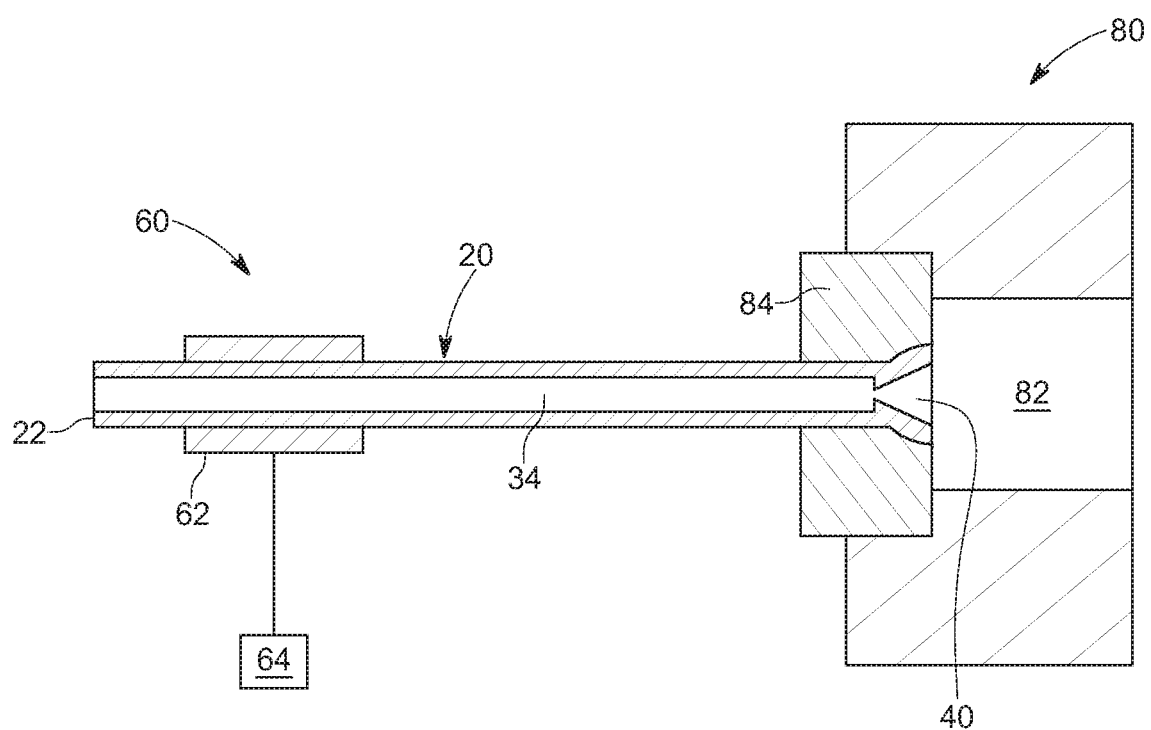
FIG. 3 illustrates a cross section of an embodiment of a capillary in a droplet generator.

FIGS. 1-3 illustrate a capillary 20. The capillary 20 has first and second opposite ends 22, 24. The capillary 20 has a main portion 26 (which is sometime referred to as ferrule) and an end portion 28 that is enlarged. The main portion 26 extends from the first end 22 to the end portion 28 and the end portion 28 extends from the main portion 26 to the second end 24. The main and end portions 26, 28 are integrally formed, such that the capillary is monolithic and the material used to form the capillary 20 is continuous throughout the main and end portions 26, 28. In a preferred embodiment, the material used to form the capillary 20 is a manufactured glass, preferably quartz, and more preferably fused silica.

The main portion 26 of the capillary 20 is generally an elongated tube-like structure, having an outer cylindrical wall 30 having a diameter OD1 and an inner cylindrical wall 32 having a diameter ID1. The inner cylindrical wall 32 defines an aperture 34 of the main portion 26 of the capillary 20. The inner cylindrical wall 32 may be formed with a nozzle (not shown) proximate to the first end 22. Diameter ID1 of the inner cylindrical wall 312 is preferably in the range of 0.001 mm to 10.0 mm.

The end portion 28 (or inlet flare) of the capillary 20 is flared/knobbed such that an outer nail 36 of the end portion 28 has a diameter OD2 at the second end 24 that is larger than the diameter OD1 of the main portion 26. In a preferred embodiment, the diameter OD2 can be as large as ten times the diameter OD1. In a preferred embodiment, the outer wall 36 of the end portion 28 is curved, such that the outer wall 36 of the end portion 28 takes on a generally semi-spherical configuration, although it is to be understood that the outer wall 36 of the end portion 28 could have any other suitable configuration, such as, for example, an angled configuration, a square configuration, an oval configuration, or a triangular configuration.

The end portion 28 of the capillary 20 further defines an inner wall 38. The inner wall 38 defines an aperture 40 of the end portion 28 which is in communication with the aperture 34 of the main portion 26. The inner wall 38 is preferably conical in configuration and thus tapers from a wider opening to a narrower opening. While the depicted configuration has a linear taper it is to be understood that the inner wall 38 of the end portion 28 could have any other suitable configuration, such as, for example, a curved configuration.

Figure 4:
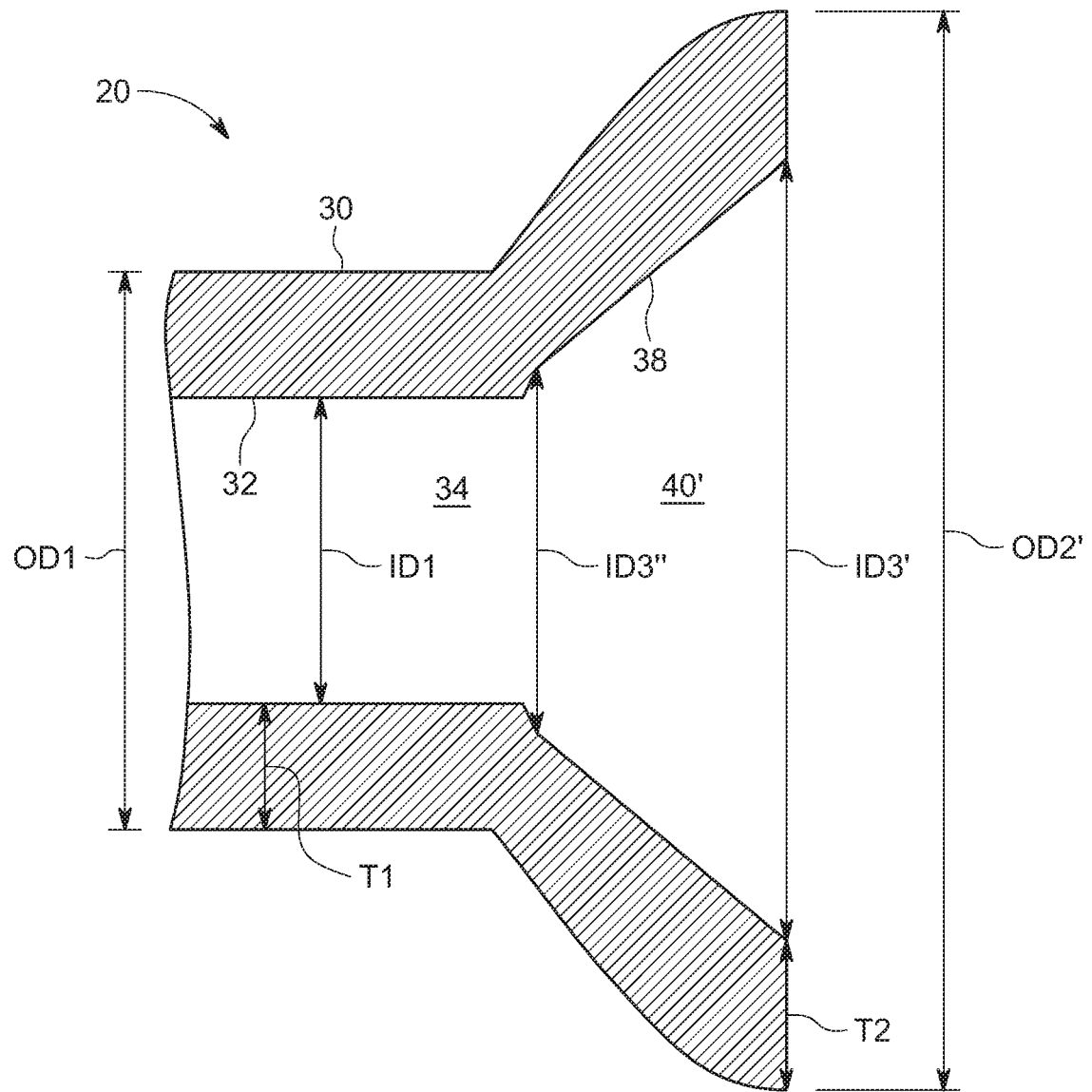
FIG. 4 illustrates a cross section of another embodiment of a capillary in a droplet generator.

The inner wall 38 of the end portion 28 has a diameter ID2' at the second end 24 of the capillary 20. In a preferred embodiment, the diameter ID2' is larger than the diameter ID1 of the main portion 26. The inner wall 38 of the end portion 28 has a diameter ID2" where the aperture 40 meets the aperture 34. Diameter ID2' is preferably equal to or greater than diameter ID2". The diameter ID2" is preferably smaller than the diameter ID1 of the main portion 26, such that a shoulder 42 is defined between the inner wall 32 of the main portion 26 and the inner wall 38 of the end portion 28, however, diameter ID2" could be larger than the diameter ID1 of the main portion 26, such that the shoulder 42 would be provided as part of the aperture 40. This is depicted in FIG. 4, which shows ID3" smaller than ID3' but larger than ID1. The minimum diameter ID2" can be of any diameter to create the aperture 40 that is separate from the outer wall 36 of the end portion 28. As best illustrated in FIG. 2, the location where the inner walls 32, 38 are joined (e.g., at the position of the shoulder 42) may be off-set as compared to the location where the outer walls 30, 36 are joined, with the location where the inner walls 32, 38 are joined is positioned closer to the first end 22 and the location where the outer walls 30, 36 are joined is positioned closer to the second end 24. In view of the foregoing, it is to be understood that the general boundaries of the first and end portions 26, 28 as defined herein are not exact.

In a preferred embodiment, a wall thickness T1 of the main portion 26 (the distance between the diameter OD1 and the diameter ID1) is less than or equal to a wall thickness T2 of the end portion 28 at the second end 24 (the distance between the diameter OD2 and the diameter ID2'). Furthermore, in a preferred embodiment, the wall thickness T1 of the main portion 26 is always less than or equal to the wall thickness T2 of the end portion 28 along an entire length of the end portion 28 to provide additional structure support. As can be appreciated from FIG. 1, the aperture 34 is substantially longer than the aperture 40 and while no precise value is required, the aperture is generally expected to be at least four times longer than the aperture 40.

Figure 5:
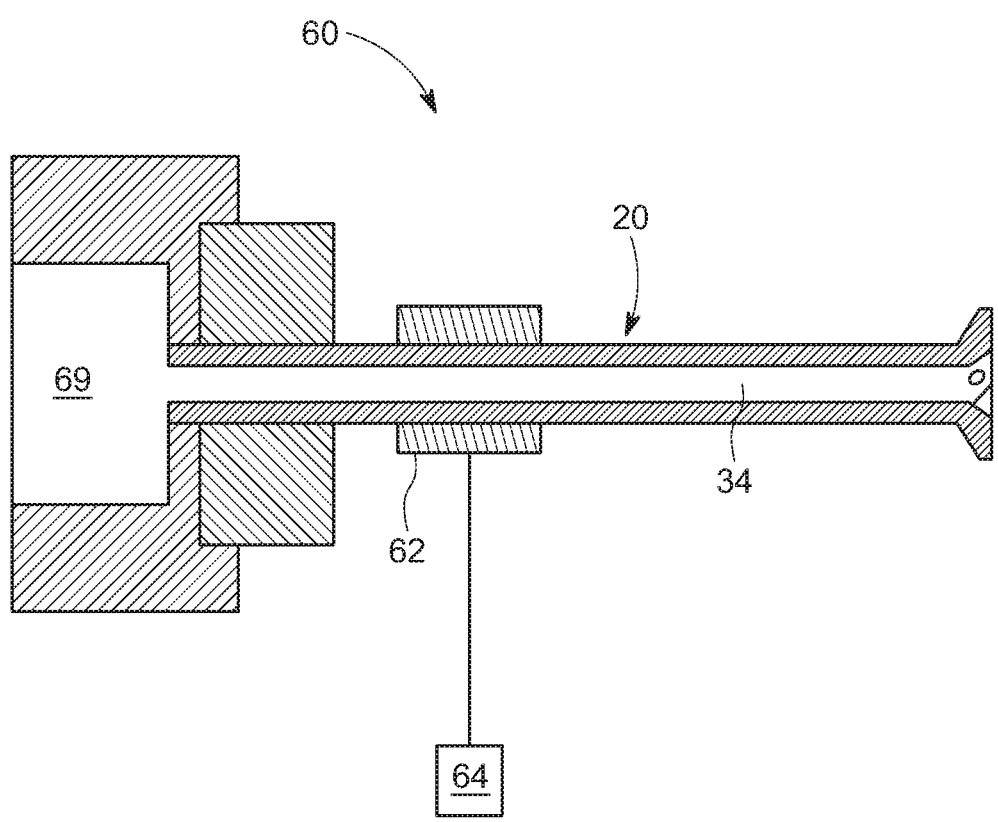
FIG. 5 illustrates a cross section of capillary connected to a reservoir of a droplet generator.

As illustrated in FIG. 3, the capillary 20 is preferably provided as a part of a droplet generator 60. The droplet generator 60 may include an actuator 62 which surrounds a part (preferably a part of the main portion 26) of the capillary 20 and a controller 64 which is connected to the actuator 62, as well as a reservoir 69 (as shown in FIG. 5). The controller 64 controls the actuator 62 according to a driving frequency. The general structure and function of the actuator 62 and controller 64 are described and illustrated in United States Patent Publication No. US 2015/0293456 A1, the contents of which are hereby incorporated by reference herein in their entirety.

The capillary 20 of the droplet generator 60 is preferably secured in place relative to a reservoir 82 formed as a part of a lithographic apparatus 80. The reservoir 82 is configured to house molten material therein. The aperture 40 of the end portion 28 of the capillary 20 is in communication with the reservoir 82 such that molten material from within the reservoir 82 can flow into the aperture 40 of the end portion 28 of the capillary 20 and, thereafter, flow into the aperture 34 of the main portion 26 of the capillary 20 and, thereafter, flow/drip/drop out of the aperture 34 of the main portion 26 of the capillary 20 at the first end 22 thereof to form the desired droplets of molten material. The aperture 40 of the end portion 28 of the capillary 20 is generally flannel shaped so as to aid in the flow of molten material into and through the capillary 20.

The capillary 20 may be secured in position in any manner desired, and the end portion 28 of the capillary 20 is sized and configured to aid in the stability of the capillary 20 in its connection to the lithographic apparatus 80. For instance, as described and illustrated in US Patent Publication No. US 2015/0293456 A1, the end portion 28 of the capillary 20 may be positioned and secured within a stiff housing 84 of the lithographic apparatus 80 such that the aperture 34 of the end portion 28 of the capillary 20 is in communication with the reservoir 82. The end portion 28 prevents, or at least substantially inhibits, push/pull out movement of the capillary 20 relative to the reservoir 82 when the capillary 20 is subject to an increased pressure. The end portion 28 is essentially stopped from movement by a wall of the stiff housing 84. It is to be understood that, regardless of the specific configuration of the portion or the lithographic apparatus 80 that holds/secures the capillary 20 (and thus the droplet generator 60) in place relative to the reservoir 82, whether it be due to the stiff housing 84 or otherwise, the end portion 28 prevents/inhibits such movement.

The capillary 20 provides for numerous improvements over prior art capillaries. For instance, the capillary 20 is not formed with any weak areas due to the fusion or combination of multiple parts. The internal geometry of the aperture 40 of the end portion 28 (which could also be referred to as the inlet) is expanded compared to prior art capillaries, thus allowing for a funnel characteristic in the final application. The internal geometry of the aperture 40 of the end portion 28 is also expanded compared to prior art capillaries, resulting in a "female" mating end-face geometry that is beneficial for certain applications. The internal geometry of the aperture 40 of the end portion 28 at diameter ID2" is controllable within a specification of ±0.025 millimeters, which is important for droplet pulse frequency specification. The length of the internal diameter at the end portion 28 (which can be semi-sphere or knob shaped) to the main portion 26 can be specified. The geometry of the internal diameter at the end portion to main portion is an internal wall structure for a ferrule body chamber it should be noted that the end portion 28 can have various diameters and geometric shapes, and the internal diameter geometries of the walls that define ID2' and ID2" can be varied in both length and size.

The embodiments provided herein address certain issues that Applicants have determined exist in existing designs. Numerous other embodiments, modifications and variations will occur to persons of ordinary skill in the art from a review of the disclosure. Thus, various versions of capillaries with various levels of features are possible.

What is claimed is:

1. A capillary, comprising:
    a main portion having an elongated tube-like shape with a first end and a second end, the main portion having an outer cylindrical wall that defines a first outer diameter and an inner cylindrical wall that defines a first aperture with a first inner diameter; and
    an end portion positioned on the second end, the end portion having an outer wall that defines a second outer diameter that is larger than the first outer diameter, the end portion having a second aperture with a second inner diameter that tapers toward a third inner diameter where the second aperture joins the first aperture, where the second inner diameter is greater than both the third inner diameter and the first inner diameter and wherein the capillary is formed in a unitary manner.

2. The capillary of claim 1, wherein the taper from the second diameter to the third diameter is linear.

3. The capillary of claim 1, wherein the third inner diameter is greater than the first inner diameter.

4. The capillary of claim 1, wherein the third inner diameter is less than the first inner diameter.

5. The capillary of claim 1, wherein the inner and outer cylindrical walls define a main portion thickness and the end portion has an end portion thickness defined by its outer wall and the second aperture, the end portion thickness being greater than or equal to the main portion thickness.

6. The capillary of claim 5, wherein the thickness of the end portion varies and is always greater than the main portion thickness.

7. The capillary of claim 1, wherein the end portion has semi-spherical configuration.

8. The capillary of claim 1, wherein the capillary is formed of a single piece of manufactured glass.

9. The capillary of claim 8, wherein the manufactured glass is quartz.

10. The capillary of claim 8, wherein the manufactured glass is fused silica.

11. A droplet generator, comprising:
    a capillary as recited in claim 1;
    an actuator which surrounds part of the capillary;
    a controller connected to the actuator and configured to drive the actuator according to a predetermined driving frequency; and
    a reservoir in communication with the capillary.

* * * * *